United States Patent
Assaderaghi et al.

(10) Patent No.: US 6,521,949 B2
(45) Date of Patent: Feb. 18, 2003

(54) SOI TRANSISTOR WITH POLYSILICON SEED

(75) Inventors: Fariborz Assaderaghi, San Diego, CA (US); Tze-Chiang Chen, Yorktown Heights, NY (US); K. Paul Muller, Wappingers Falls, NY (US); Edward J. Nowak, Essex Junction, VT (US); Ghavam G. Shahidi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/848,508

(22) Filed: May 3, 2001

(65) Prior Publication Data

US 2002/0164841 A1 Nov. 7, 2002

(51) Int. Cl.[7] .......................... H01L 27/01; H01L 27/12; H01L 31/0392
(52) U.S. Cl. .......................... 257/347; 257/377; 257/401
(58) Field of Search .......................... 257/66, 347, 349, 257/369, 377, 401

(56) References Cited

U.S. PATENT DOCUMENTS

| | | |
|---|---|---|
| 5,486,282 A | 1/1996 | Datta et al. |
| 5,534,094 A | 7/1996 | Arjavalingam et al. |
| 5,776,823 A | 7/1998 | Agnello et al. |
| 5,796,166 A | 8/1998 | Agnello et al. |
| 6,271,541 B2 * | 8/2001 | Yamaguchi et al. ........ 257/347 |

* cited by examiner

Primary Examiner—Olik Chaudhuri
Assistant Examiner—Hoai Pham
(74) Attorney, Agent, or Firm—Jay H. Anderson

(57) ABSTRACT

Short channel effects are effectively suppressed by steep impurity concentration gradients which can be placed with improved accuracy of location and geometry while relaxing process tolerances by implanting impurities in a polysilicon seed adjacent a conduction channel of a transistor and diffusing impurities therefrom into the conduction channel. The polysilicon seed also allows the epitaxial growth of polysilicon source/drain contacts therefrom having a configuration which minimizes current density and path length therein while providing further mechanical advantages.

2 Claims, 4 Drawing Sheets

SOI TRANSISTOR WITH POLYSILICON SEED

BACKGROUND OF THE INVENTION

1. Field of the Invention

The present invention generally relates to the formation of high performance transistors with reduced short channel effects at small size on wafers or chips of silicon-on-insulator (SOI) construction.

2. Description of the Prior Art

The potential for increased performance and functionality of integrated circuits by increased proximity of devices has provided a strong incentive to increase integration density to decrease length of signal propagation paths, and increase the number of devices which can be formed on a single chip of a given size. Reduction of signal path length reduces interconnection resistance and capacitance and allows reduction of signal propagation time as well as susceptibility to capacitive or inductive coupling of noise. Such reductions in interconnect capacitance must also be accompanied by reductions in device dimensions both to reduce parasitic capacitances which reduce switching speed and to allow optimal reduction of interconnect length consistent with suitable dimensions for isolation structures. Accordingly, lithographic techniques have become very sophisticated and can produce minimum feature sizes of a fraction of a micron.

In general, while semiconductor processing techniques have been developed to form structures having dimensions much smaller than can be resolved by lithographic exposure techniques, at least one lithographic exposure is necessary to define the location and general dimensions of a device or other structure. However, while some structures can be formed at such small sizes, others cannot and adjustments in operating parameters are often required. In other cases, difficulty in scaling semiconductor structures when seeking to exploit newly developed lithographic capabilities may be the principal limiting factor in the successful reduction of active device dimensions or limit the performance which can be obtained from an active device of a given size at the limit of lithographic resolution. Some active device structures simply do not scale well to smaller sizes.

For example, in field effect transistors, short channel effects which cause leakage and reduction in resistance differential between "on" and "off" states have been recognized for many years as the conduction channel length was reduced in transistor designs. This problem led to the development of lightly doped drain structures, now more generally referred to as extension implants since optimal impurity concentrations can be substantial while the dimensions thereof are generally very small. Also, gate to substrate capacitance has limited performance and led to so-called "halo" implants to increase the impurity concentration gradient in the substrate below the gate structure. Both of these structures require that the impurity concentration be well-controlled and the concentration gradients be very steep, particularly in devices of small size.

In general, impurities are placed in desired locations by implantation which can be controlled to sub-lithographic dimensions by known techniques. However, implantation must be followed by a closely controlled heat treatment or annealing process to repair lattice damage from the implantation and to activate the impurity by incorporation in the lattice structure. Such heat treatment also causes diffusion of the impurity which cannot be avoided and the implant location must often be adjusted to compensate for the diffusion so that the final impurity location will be as intended. The location of impurities and the multi-dimensional geometry of impurity concentration gradients prior to annealing is particularly critical in extremely small devices.

The mechanics of diffusion are inherent material properties and are well-understood to depend upon the materials (and the microstructure thereof), temperature, time and impurity concentration gradient. Many state-of-the-art semiconductor structure designs therefore have a heat budget which cannot be exceeded without compromise of the intended electrical properties of the device.

Viewed another way, a given amount of heat treatment required following impurity implantation to repair lattice damage and activate the impurity will inevitably lead to a reduction in the steepness of impurity concentration gradient while decreased size of active semiconductor devices, and field effect transistors, in particular, makes the steepness of impurity concentration gradients much more critical in smaller devices in order to obtain optimal device performance. This can be understood from the fact that a scaling of a transistor to smaller dimensions would require increase in the impurity concentration gradient while that increase in concentration gradient may not be possible or available consistent with annealing after an impurity implantation and other device impurity concentration requirements.

To obtain high performance and consistency of conduction characteristics of transistors formed on a chip or wafer, silicon-on-insulator substrates have been employed in recent years, largely due to the extremely high quality of monocrystalline silicon which is produced in a relatively thin surface layer. However, certain electrical characteristics and device structure designs may be complicated by the placement of the high quality surface layer on an insulator which insulates it from the bulk or handling substrate provided to reduce fragility of the wafer or chip. In particular, deep structures, contacts and buried elements such dual gate transistor designs that may provide significant performance enhancements may be difficult to form and process windows may be significantly restricted.

At the same time, however, many semiconductor manufacturing processes are very mature and well-developed and, possibly, having tool costs largely amortized. Therefore, there is substantial incentive to develop device designs which can be fabricated at extremely small size on SOI substrates without major departures from established and well-understood processes or, to the extent such major departures may be necessary, to develop device designs which can be fabricated using alternative by nevertheless mature and well-understood processes. However, most such designs, to date, when scaled to extremely small sizes remain subject to a significant degree of short channel effects and/or require new processes which may be expensive and of uncertain manufacturing yield. In general, reduction of short channel effects has not been optimal due to the physical constraints and difficulties in developing steep impurity profile gradients regardless of the processes attempted.

By the same token, when seeking to obtain maximal performance of devices approaching the limits of lithographic resolution, current density in all parts of the device becomes of substantial importance. While substantial improvements have been made within active regions of transistors, most improvement in contact design have focused on materials to reduce bulk resistance and metal adhesion. However, it has recently been fount that conventional contact geometries cannot be directly applied to some technologies or present problems of high current density at some locations within them that are significant to overall device performance. For example, raised source and drain (RSD) structures must be formed when field effect transistors are formed on very thin SOI in order to provide sufficient volume of silicon to develop silicide contacts (and for other reasons) but these structures and other "flat" structures formed substantially parallel to the substrate surface necessarily have geometries which cannot avoid concentration of current at some location within them. At the present time, there have been few, if any, alternatives to flat source/drain contacts due to the need to lithographically define the implant regions.

SUMMARY OF THE INVENTION

It is therefore an object of the present invention to provide a field effect transistor design which can be fabricated on SOI wafers or chips at extremely small size including sub-lithographic channel lengths and extremely high integration density with well-understood and mature processes.

It is another object of the invention to provide a transistor having improved source/drain contact geometry at extremely small sizes and which do not concentrate current density.

It is a further object of the invention to provide a transistor design suitable for extremely high density integration which allows increased precision of location of implanted impurities and precision of geometry of impurity concentration gradients.

It is another object of the invention to provide a manufacturing method which can be carried out with high manufacturing yield to form high performance transistors with much reduced susceptibility to short channel effects.

In order to accomplish these and other objects of the invention, a method of fabricating a transistor is provided including steps of forming a polysilicon seed in contact with a conduction channel of a transistor, and epitaxially growing a polysilicon source/drain contact region from the polysilicon seed and/or implanting impurities in a polysilicon seed formed adjacent a conduction channel of a transistor, and difflusing the impurities into the conduction channel.

In accordance with another aspect of the invention a semiconductor device is provided comprising a polysilicon seed formed adjacent to a conduction channel of a transistor, and a polysilicon source/drain region epitaxially grown from said polysilicon seed to form a contact.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
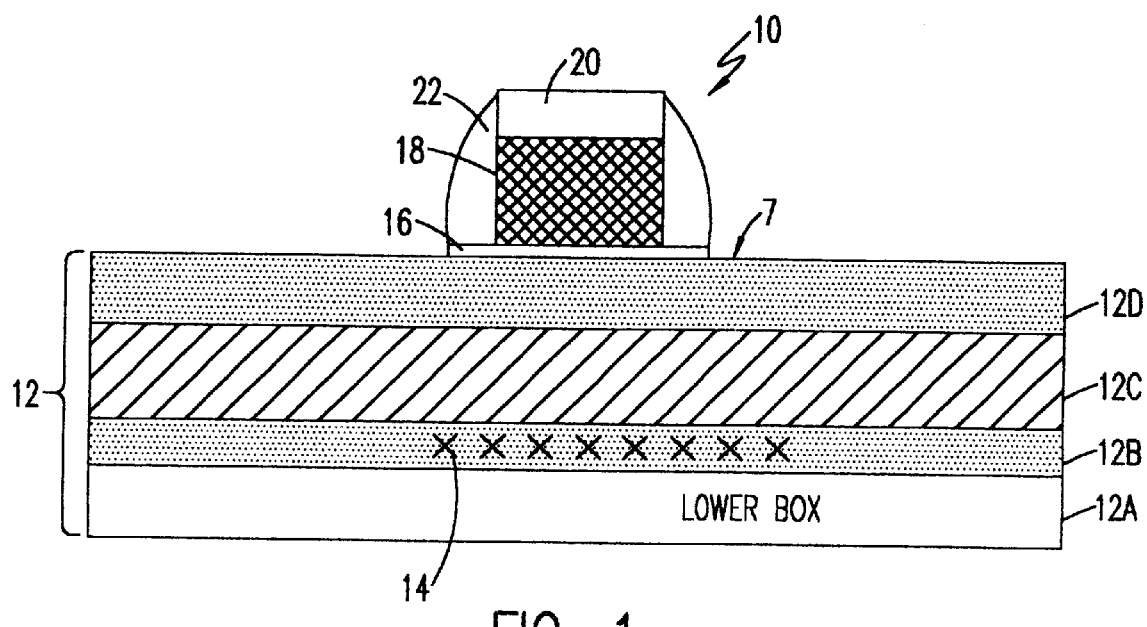
FIG. 1 is a cross-sectional view of an early stage in fabrication of a field effect transistor in accordance with the invention.

Referring now to the drawings, and more particularly to FIG. 1, there is shown, in cross-section, an early stage in the manufacture of a transistor in accordance with the present invention. Those skilled in the art will recognize that the gate structure 10 is, at this point, similar to conventional gate structures and that the chip or wafer 12 is depicted as a silicon-on-insulator (SOI) structure. It should be appreciated, however, that the invention is also applicable to bulk semiconductor wafers and to semiconductor materials other than silicon and mixtures and alloys thereof, such as SiGe on insulator. The configuration of the various layers of the SOI is not at all critical to the practice of the invention and is depicted principally for illustrative purposes to demonstrate compatibility of the invention with virtually any such configuration. By the same token, a transistor in accordance with the invention can be formed at any location where a layer of silicon overlies a layer of insulator at any level of a semiconductor device.

While SOI wafers are commercially available, any desired layer configuration can also be formed or modified as part of the manufacturing process but optional and incidental to the practice of the invention. SOI wafers will generally include a relatively thick buried oxide layer 12 which can be formed by numerous techniques well-understood by those skilled in the art. When a further, thin oxide layer 12c is included, the buried oxide layer 12a is referred to as a lower buried oxide. The thin or upper buried oxide 12c can be formed, leaving an underlying layer of silicon 12b separating it from lower buried oxide 12a, by a well-understood SIMOX process including an oxygen implant followed by annealing. The silicon layer 12b can be beneficially used, for example, as a ground plane to regulate electrical fields within the transistor conduction channel under the gate structure by implanting impurities in at least the upper region thereof, as indicated by reference numeral 14.

While variations of the gate structure 10 can be used in the practice of the invention, the gate structure illustrated in FIG. 1 is preferably formed by deposition or growth of a thin gate oxide or other dielectric or composite layer 16, a gate polysilicon layer 18 and a cap layer 20, preferably of nitride. The cap layer and polysilicon layers can then be patterned together with or separately from the patterning of the gate oxide layer 16. If performed separately, the order thereof is unimportant to the successful practice of the invention. The patterned gate oxide layer 16 need not extend beyond the gate polysilicon as shown although it may be convenient to do so; allowing gate insulator layer 16 to be patterned in accordance with sidewall 22 after functioning as an etch stop for patterning polysilicon 18. Sidewall spacers 22 are then formed by an isotropic deposition of an insulator such as nitride or oxide (preferably, a material different from cap 20 to allow cap 20 to be selectively removed) followed by an anisotropic etch.

Figure 2:
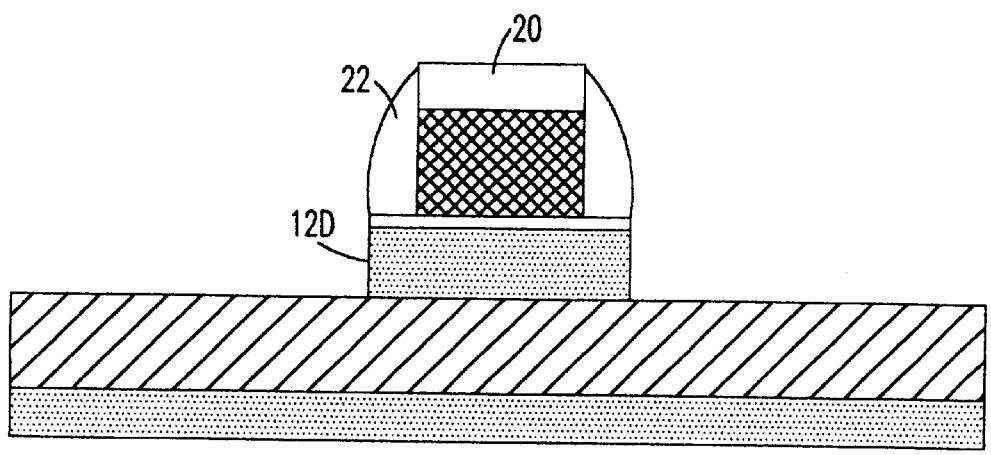
FIGS. 2, 3, 4, 5 and 6 are intermediate stages in fabrication of a field effect transistor in accordance with the invention illustrating the fabrication process.
Figure 3:
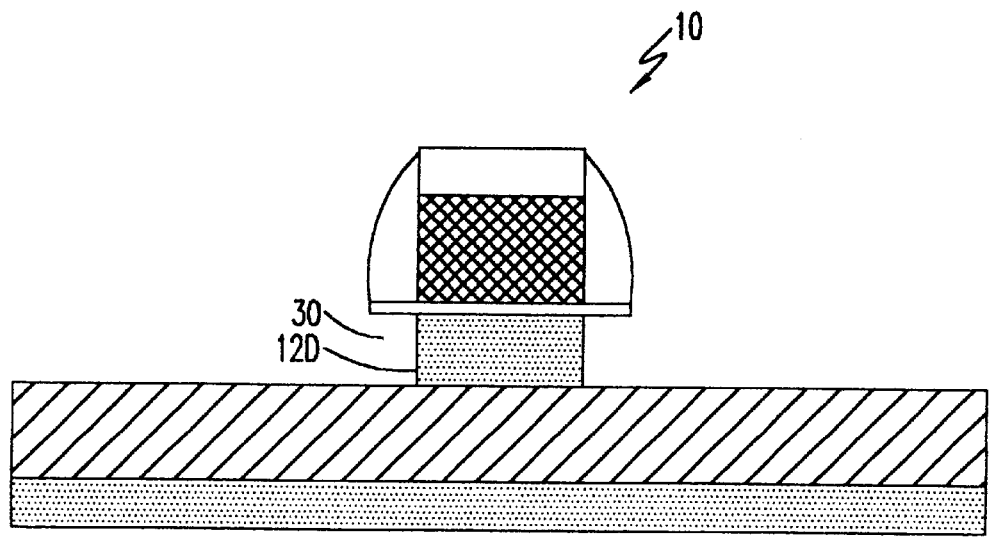

Referring now to FIG. 2, SOI layer 12d is patterned by an anisotropic etch such as reactive ion etching (RIE) selective to nitride and oxide and preferably using the upper buried oxide as an etch stop and the gate sidewalls 22 and cap 20 as a mask. This process is followed by an isotropic timed etch of the SOI layer 12d to undercut edges of the gate structure as shown at reference numeral 30 of FIG. 3. An angled implant into the remaining silicon of layer 12d could be performed at this time by is not preferred since better impurity location control can be achieved by diffusion from a solid body as will be discussed in detail below.

Figure 4:
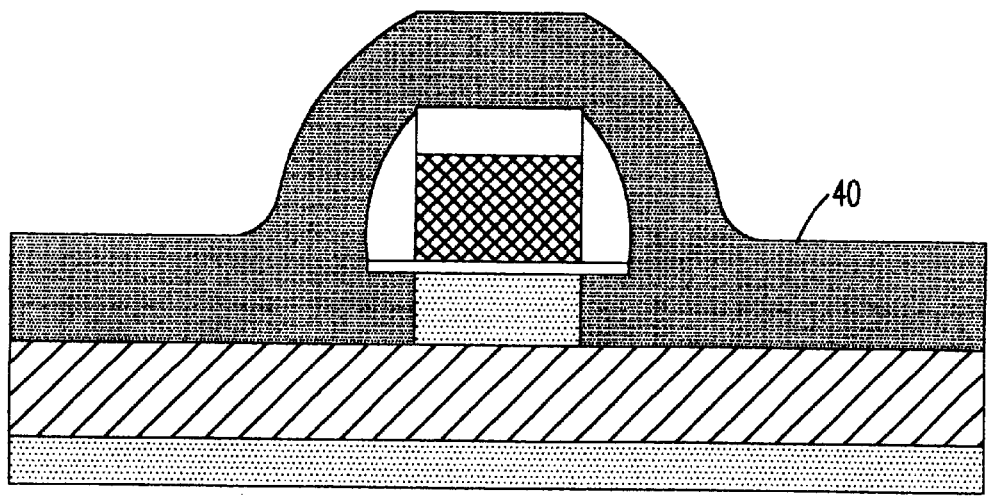
Figure 5:
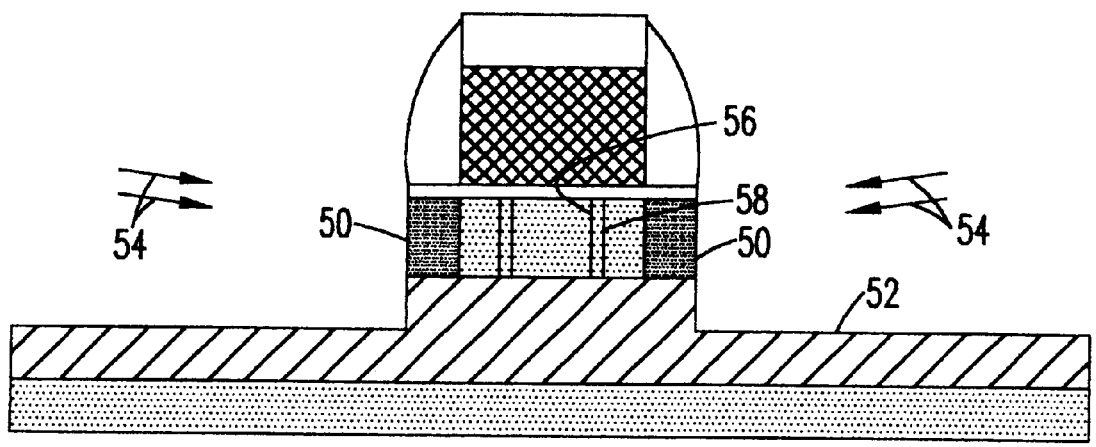

Referring now to FIG. 4, a layer of polysilicon 40 is deposited isotropically to fill undercuts 30. In general, filling of the undercuts can be substantially assured by isotropic deposition of a layer having a thickness approximately twice the dimension of the undercut distance. It is preferred that the silicon be undoped but doped polysilicon could be used. The polysilicon layer is then removed by an anisotropic (e.g. RIE) etch selective to oxide and nitride so that the portions 50 of polysilicon layer 40 filling undercuts 30 are not disturbed, as shown in FIG. 5. These remaining polysilicon regions 50 will serve as seeds for polysilicon epitaxial growth which will be discussed below.

As further shown in FIG. 5, it is preferred but not necessary to perform a timed anisotropic etch to recess the upper oxide layer 12c as indicated at 52. This recess serves to increase exposure of polysilicon seed 50 that facilitates and improves manufacturing yield of further processes of implantation and contact polysilicon growth.

As indicated by arrows 54 shallow angle halo and extension implants can now be performed to implant impurities (of opposite conductivity types for the respective halo and extension implants) into the polysilicon seeds; each followed by a drive-in annealing heat treatment process. The angle is preferably as shallow as possible, consistent with the proximity and height of adjacent transistors, generally in the range of 5° to 15° to the substrate surface. This process has the beneficial effects of locating the impurity concentration gradient very close to parallel with the polysilicon seed/undercut surface and increases the process window in regard to implantation energy which should be chosen to avoid implantation into the monocrystalline region 12d. However, as will be discussed below, if the impurity concentration gradient is properly oriented substantially parallel to the surface of the monocrystalline material 12d, the location of the peak impurity concentration and the width thereof within the polysilicon seed is much less critical.

The invention exploits the recognition that impurities will diffuse much more rapidly (e.g. by a factor of ten or more) along grain boundaries than through monocrystalline silicon or monocrystalline grain of polysilicon. Therefore, impurities for the halo implant and source/drain extensions can be diffused along the polysilicon grains during a subsequent drive in anneal process. Rapid diffusion along the grain boundaries in the polysilicon, particularly in comparison with diffusion rates in monocrystalline silicon, maintains a nearly constant impurity concentration at the interface of the polysilicon seed 50 and silicon layer 12d and results in a sharp gradient of impurity concentration to form halo structure 56 and extension structure 58, particularly over short distances in the monocrystalline silicon. In other words, the more rapid diffusion along grain boundaries provides an enhancement to diffusion even from another type of solid body since a high and substantially constant impurity concentration is maintained at the monocrystalline material surface.

It should be noted that this diffusion distance will generally be quite short since it will be a relatively small fraction of the channel length which, in turn, may be less than the minimum feature size since the gate width can be of a lithographic resolution limited size and the channel length reduced by undercut 30. That is, the gradient will, in effect, be scaled to a substantial degree in accordance with the device size for small sizes, particularly for minimum feature size regimes below one micron where the diffusion length in monocrystalline silicon will be a few tens of nanometers or possibly much less.

Figure 6:
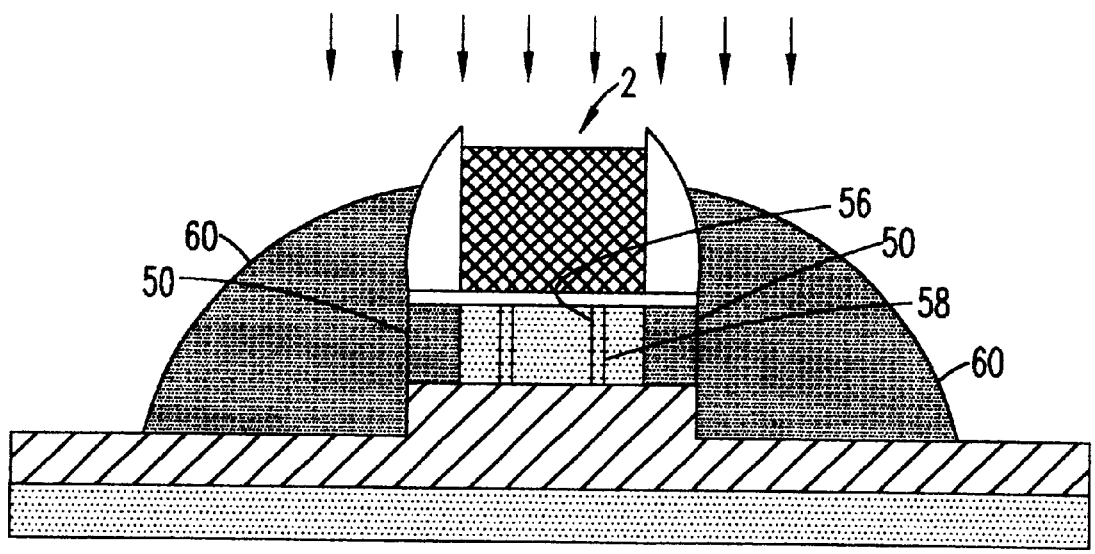

Referring now to FIG. 6, source and drain contacts are epitaxially grown from the surface of the polysilicon seed 50. Particularly in connection with the oxide recess 52, the epitaxially grown polysilicon contacts become rounded, much in the shape of a quarter-sphere or quarter-ellipsoid with all points on the contact/growth surface substantially equidistant from the seed which also forms the source or drain. Therefore, the contact surface is maximized while path lengths from the surface to the source or drain ar minimized and direct; avoiding any geometry which could concentrate current density or increase resistance within the contact while providing substantially improved access for interconnections to the contact and improved metal adhesion through the increased area and rounded surface shape.

Figure 7:
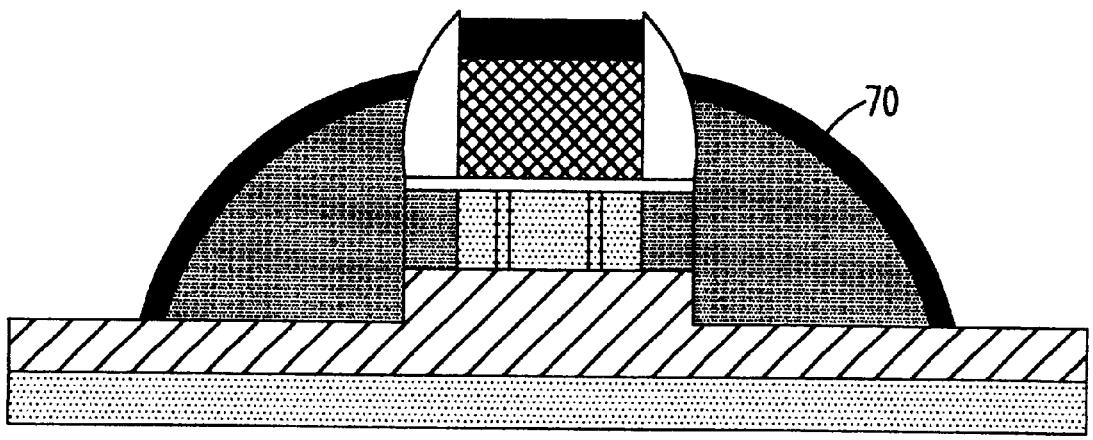
FIG. 7 is a cross-sectional view of a substantially completed transistor in accordance with the invention.

The transistor can then be substantially completed by removal of nitride cap 20 and performing impurity implantation in the source, drain and gate regions to desired concentrations either concurrently or separately, as generally indicated by arrows 62. These implantations can be either angled or vertical which may assist in developing the desired concentrations. The implantation is followed by a drive-in and activation anneal which may be performed quickly since the impurity will diffuse rapidly along grain boundaries in the polysilicon source, drain and gate. Then, if desired, as is preferred, the contact formation is completed as shown in FIG. 7 by deposition of metal, such as tungsten and rapid annealing to form silicide 70, which can be coordinated with the contact implant and/or the halo and extension structures.

In view of the foregoing, it is seen that the invention provides for improved extension and halo impurity structures which have a wider process window and commensurately increased manufacturing yield simultaneously with the development of an electrically and mechanically improved contact structure. The transistor in accordance with the invention can be fabricated with a channel length shorter than the minimum lithographic feature size while effectively suppressing short channel effects and resistance differential between on and off states of the transistor is not compromised by connection resistance and current density and path length through the contacts are both minimized. Further, either of the technique of forming contacts and the technique of developing steep impurity concentration gradients with accurately determinable location and geometry can be practiced to the exclusion of the other in a given device should there be reason to do so.

While the invention has been described in terms of a single preferred embodiment, those skilled in the art will recognize that the invention can be practiced with modification within the spirit and scope of the appended claims.

Having thus described my invention, what I claim as new and desire to secure by letter patent is as follows:

1. A semiconductor device including a transistor having a gate structure with an upper portion including an overhanging portion overhanging a conduction channel of the transistor, the device comprising:

a polysilicon seed formed beneath the overhanging portion and adjacent the conduction channel of the transistor and in contact therewith, said polysilicon seed having an inner edge defined by the conduction channel and an outer edge defined by the upper portion of the gate structure; and a polysilicon source/drain region epitaxially grown from said polysilicon seed to form a contact.

2. A semiconductor device as recited in claim 1, further comprising an impurity structure in said conduction channel having a geometry determined by diffusion of an impurity from said polysilicon seed.

* * * * *